US007344384B2

(12) United States Patent
Rubenstein et al.

(10) Patent No.: US 7,344,384 B2
(45) Date of Patent: Mar. 18, 2008

(54) BOLSTER PLATE ASSEMBLY FOR PROCESSOR MODULE ASSEMBLY

(75) Inventors: Brandon Aaron Rubenstein, Loveland, CO (US); Andrew D. Delano, Fort Collins, CO (US); Bradley E. Clements, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 283 days.

(21) Appl. No.: 10/972,688

(22) Filed: Oct. 25, 2004

(65) Prior Publication Data

US 2006/0087014 A1 Apr. 27, 2006

(51) Int. Cl.
*H01R 12/00* (2006.01)

(52) U.S. Cl. ........................................ 439/73; 361/704

(58) Field of Classification Search ................. 439/73, 439/330, 331; 361/704, 719
See application file for complete search history.

(56) References Cited

U.S. PATENT DOCUMENTS

| | | | | |
|---|---|---|---|---|
| 5,287,757 | A * | 2/1994 | Polaert et al. | 73/862.627 |
| 5,749,301 | A * | 5/1998 | Wronkiewicz et al. | 105/199.3 |
| 6,015,081 | A * | 1/2000 | Okabayashi et al. | 228/180.22 |
| 6,042,388 | A * | 3/2000 | Tustaniwskyj et al. | 439/66 |
| 6,330,745 | B1 | 12/2001 | Cromwell et al. | |
| 6,475,011 | B1 * | 11/2002 | Sinha et al. | 439/330 |
| 6,589,244 | B1 * | 7/2003 | Sevrain et al. | 606/72 |
| 6,634,890 | B2 | 10/2003 | Peterson et al. | |
| 6,635,513 | B2 | 10/2003 | Hensley et al. | |
| 6,639,800 | B1 | 10/2003 | Eyman et al. | |
| 6,724,629 | B1 | 4/2004 | Augustin et al. | |
| 6,743,026 | B1 * | 6/2004 | Brodsky | 439/73 |
| 6,757,965 | B2 * | 7/2004 | Colbert et al. | 39/836 |
| 6,783,299 | B2 * | 8/2004 | Meron et al. | 403/325 |
| 7,095,614 | B2 * | 8/2006 | Goldmann | 361/704 |
| 7,101,193 | B2 * | 9/2006 | Brodsky | 439/66 |
| 2001/0002160 | A1 | 5/2001 | Bookhardt et al. | |
| 2003/0019097 | A1 | 1/2003 | White | |
| 2003/0072608 | A1 | 4/2003 | Hegde | |
| 2004/0038583 | A1 | 2/2004 | Peterson et al. | |
| 2004/0089937 | A1 | 5/2004 | Hensley et al. | |

* cited by examiner

*Primary Examiner*—Briggitte R. Hammond
*Assistant Examiner*—Larisa Tsukerman

(57) ABSTRACT

Systems, methodologies, methods of manufacture, and other embodiments associated with semiconductor/processor module assemblies are described. One exemplary system embodiment includes a bolster plate assembly for a semiconductor module assembly that includes a bolster plate and a leaf spring pre-loaded onto the bolster plate. The example system may also include the leaf spring being releasably attached to the bolster plate and positioned to provide a force in a direction generally away from the bolster plate. The leaf spring can be configured to release from the bolster plate upon attaching the semiconductor module assembly to the bolster plate that causes the leaf spring to exert the force in the direction generally away from the bolster plate and against a semiconductor module assembly.

18 Claims, 5 Drawing Sheets

BOLSTER PLATE ASSEMBLY FOR PROCESSOR MODULE ASSEMBLY

BACKGROUND

A processor module assembly typically includes multiple layers of components, such as a processor and a heat sink, that are assembled and attached together. Prior methods for attaching a heat sink to a processor included top-attach methods that used spring-loaded screws or a cantilever spring across the top of the heat sink (see U.S. Pat. No. 6,634,890) that pull from the bottom of the heat sink assembly. Top-mounted spring-loaded screws or cantilevers require relatively large amounts of heat sink space to operate. The space could otherwise be used as an area for conducting heat. Depending on the design, top-loading systems may also use special installation procedures to ensure the load on the processor chip is not excessively uneven.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that one element may be designed as multiple elements or that multiple elements may be designed as one element. An element shown as an internal component of another element may be implemented as an external component and vice versa. Furthermore, elements may not be drawn to scale.

DETAILED DESCRIPTION

Example systems, methods, methods of manufacture, and other embodiments are described that are associated with a processor module and assembly of the processor module. In one example assembly for a processor module assembly, a bolster plate and a leaf spring are provided. The leaf spring can be pre-loaded onto the bolster plate where the leaf spring is attached to the bolster plate in a locked state. Upon attaching other components of the processor module assembly to the bolster plate, the leaf spring is configured to change to an unlocked state where it exerts a force in a direction generally away from the bolster plate and against the processor module assembly. For example, the leaf spring can be used to apply a force to hold down a processor chip and heat sink to a board. The example leaf spring can be pre-assembled into the bolster plate to provide spring-load that, in some designs, can reduce travel distances for screws used for final assembly of the processor module assembly. It will be appreciated that the term processor module is intended to also include semiconductor modules.

The following includes definitions of selected terms employed herein. The definitions include various examples and/or forms of components that fall within the scope of a term and that may be used for implementation. The examples are not intended to be limiting. Both singular and plural forms of terms may be within the definitions.

"Computer-readable medium", as used herein, refers to a medium that participates in directly or indirectly providing signals, instructions and/or data. A computer-readable medium may take forms, including, but not limited to, non-volatile media, volatile media, and transmission media. Non-volatile media may include, for example, optical or magnetic disks and so on. Volatile media may include, for example, semiconductor memories, dynamic memory and the like. Transmission media may include coaxial cables, copper wire, fiber optic cables, and the like. Transmission media can also take the form of electromagnetic radiation, like that generated during radio-wave and infra-red data communications, or take the form of one or more groups of signals. Common forms of a computer-readable medium include, but are not limited to, a floppy disk, a flexible disk, a hard disk, a magnetic tape, other magnetic medium, a CD-ROM, other optical medium, punch cards, paper tape, other physical medium with patterns of holes, a RAM, a ROM, an EPROM, a FLASH-EPROM, or other memory chip or card, a memory stick, a carrier wave/pulse, and other media from which a computer, a processor or other electronic device can read. Signals used to propagate instructions or other software over a network, like the Internet, can be considered a "computer-readable medium."

Figure 1:
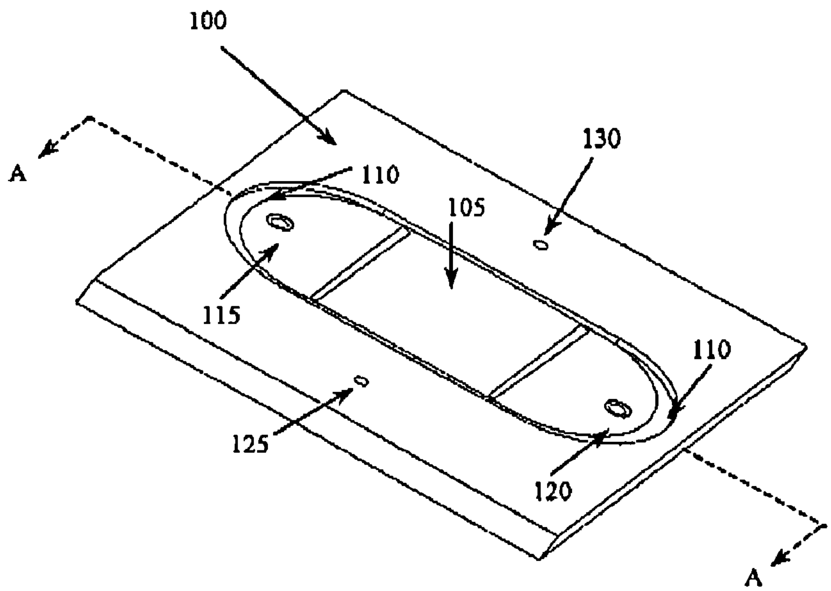
FIG. 1 illustrates one embodiment of an example bolster plate assembly having a pre-loaded leaf spring.

FIG. 1 illustrates an example bolster plate assembly for a processor module assembly that includes a bolster plate 100 and a leaf spring 105. The leaf spring 105 is shown being pre-loaded and attached onto the bolster plate 100. The bolster plate 100 is configured to provide support for a processor module assembly and the leaf spring 105 can be configured to apply a force to the processor module assembly to assist in holding down components of the processor module.

In one embodiment, the bolster plate 100 and the leaf spring 105 are separate components that can be pre-assembled. The leaf spring 105 can be formed with a generally arced shape such as the example shown in FIG. 3. The leaf spring 105 can be pre-loaded by releasably attaching the leaf spring 105 to the bolster plate 100. Once attached, the leaf spring 105 can be regarded as being in a locked and otherwise compressed state where the spring 105 is generally flat against the bolster plate 100. It will be appreciated that the leaf spring 105 may still include a minimal arc depending on desired tolerances. The leaf spring 105 can be configured to be released from the bolster plate 100 during attachment of the processor module assembly so that the leaf spring 105 provides a force against the processor module assembly. It will be appreciated that the force applied by the leaf spring 105 can be variable.

In one example configuration, the leaf spring 105 can be formed as a plate-like spring (e.g. see FIGS. 1-3) and may include a plurality of standoffs that project out from the leaf spring. Examples include standoffs 115 and 120 that are positioned at ends of the leaf spring 105 and project out toward the bolster plate 100. The bolster plate 100 can include corresponding openings (seen in FIG. 2) to receive the standoffs 115, 120. Each standoff 115 and 120 can include a threaded inner opening that is configured to receive a screw. In another example, the bolster plate 100 can include a recess 110 that is configured to receive the leaf spring 105. Upon inserting the leaf spring 105 into the recess 110, the leaf spring 105 can be generally flush with a top surface of the bolster plate 100. The bolster plate 100 may also include additional openings such as openings 125 and 130 that can receive additional screws used for attaching a processor module to the bolster plate 100.

Figure 2:
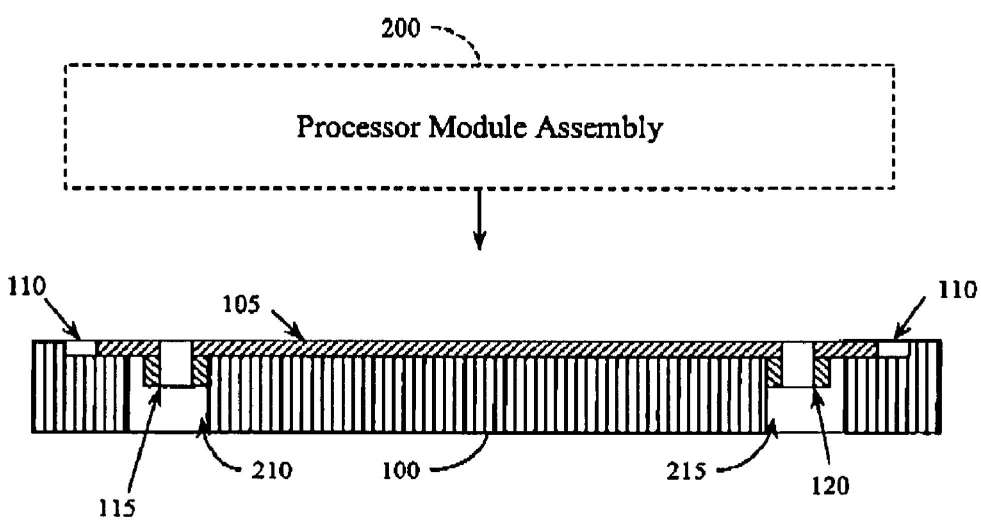
FIG. 2 illustrates an example cross-section view of the bolster plate assembly of FIG. 1 through lines A-A.

Illustrated in FIG. 2 is an example cross-section view of the bolster plate assembly of FIG. 1 shown through lines A-A. FIG. 2 also shows an example processor module assembly 200 that can be attached to the bolster plate 100. The processor module assembly 200 is used herein to refer to other components that can be assembled together with the bolster plate 100. For example, the processor module assembly 200 can include one or more layers of components such as a processor chip, a circuit board, a heat sink, and the like. A more detailed example of the processor module assembly 200 will be described with reference to FIG. 5. It will be appreciated that the assembly of the components can include attaching the components to each other in a variety of sequences. The present example does not imply that the processor module assembly 200 is necessarily assembled together and then attached to the bolster plate 100 as a single unit.

With further reference to FIG. 2, the bolster plate 100 can include a plurality of openings such as openings 210 and 215 that are configured to correspond and receive the standoffs 115 and 120 of the leaf spring 105. To pre-load the leaf spring 105 onto the bolster plate 100, the leaf spring can be pressed onto the bolster plate 100 such that the standoffs 115 and 120 are positioned within corresponding openings 210, 215. The openings 210 and 215 can be larger (e.g. wider) than the standoffs 115 and 120 to provide space for the leaf spring 105 to unlock and release from the bolster plate 100 during assembly with the processor module 200. Example relationships between the openings 210 and 215 to the standoffs 115 and 120 of the leaf spring are described with reference to FIGS. 3 and 4

Figure 3:
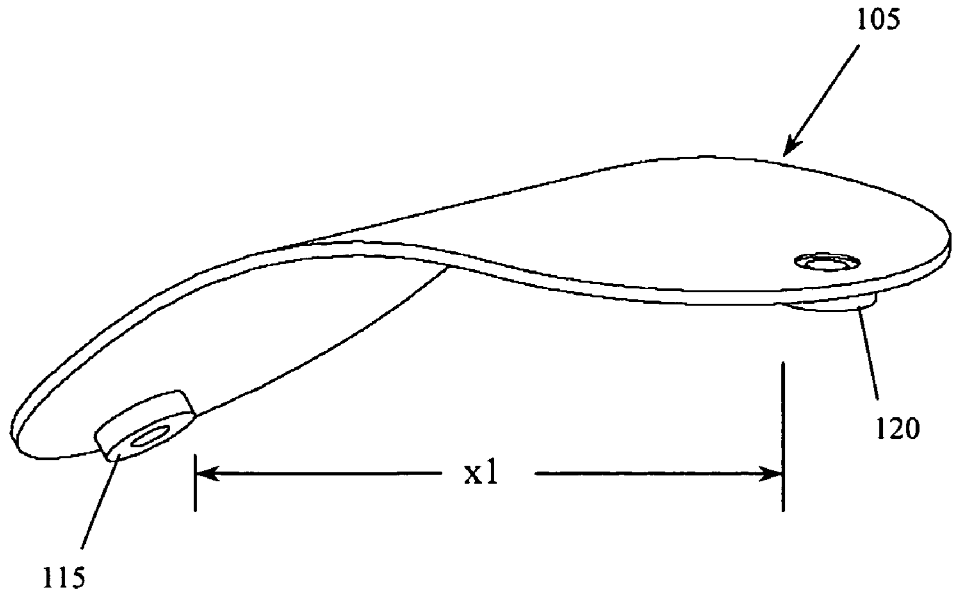
FIG. 3 illustrates one embodiment of an example leaf spring.

Illustrated in FIG. 3 is one example of the leaf spring 105 in an uncompressed state. The leaf spring 105 can be formed with a generally arced shape and can have a variety of desired geometries such as oval, rectangular, cloverleaf, and others. In one example, the leaf spring 105 can have about a 10° arc while in an uncompressed state but other arc sizes can be used. The standoffs 115 and 120 can be positioned at the ends of the leaf spring 105. A distance X1 is illustrated that represents a distance between the standoffs 115 and 120 while the leaf spring 105 is in the uncompressed state.

Figure 4:
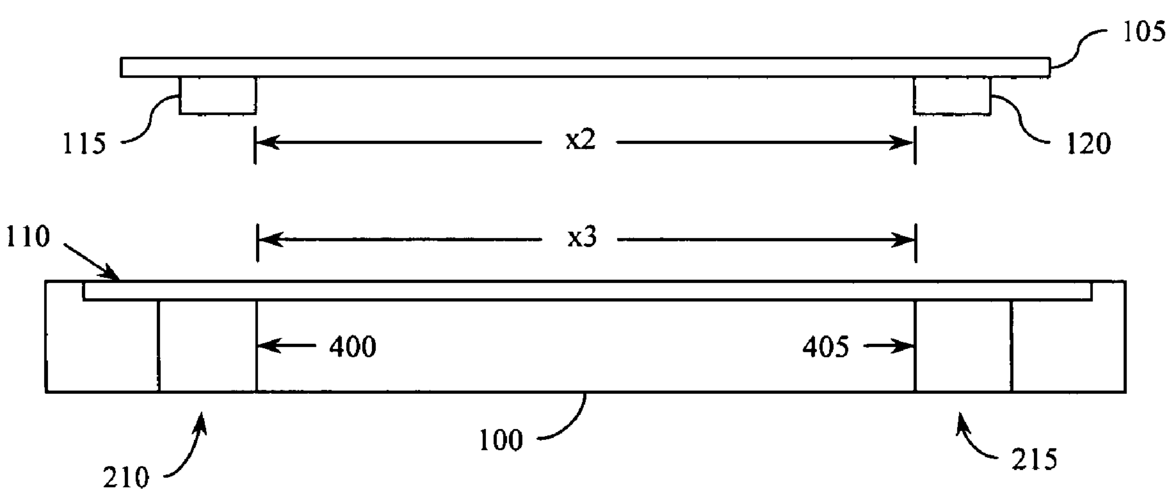
FIG. 4 illustrates an example side view of the bolster plate assembly of FIG. 2 with the leaf spring separated from the bolster plate.

Illustrated in FIG. 4 is the example bolster plate assembly shown in FIG. 2 where the leaf spring 105 is separated from the bolster plate 100. The example leaf spring 105 is shown in a generally flat or compressed state, which it may be in when pre-loaded to the bolster plate 100. When the leaf spring 105 is generally flat, the standoffs 115 and 120 will be a distance X2 apart from each other. The distance X2 can be regarded as the greatest distance between the standoffs 115 and 120 since the standoffs 115 and 120 will be drawn closer to one another upon bending of the leaf spring 105. Thus, distance X1 is less than distance X2.

Referring to an example relationship between the openings 210 and 215 of the bolster plate 100 and the standoffs 115 and 120, a distance X3 is illustrated that represents a distance between the openings 210 and 215 (e.g. between inner side walls 400 and 405, respectively). To be able to attach or otherwise load the leaf spring 105 onto the bolster plate 100, the distance X3 can be greater than the distance X1 and less than or equal to the distance X2. To load, the leaf spring 105 can be pressed against the bolster plate 100, and the standoffs 115, 120 can be pressed into their corresponding holes, 210 and 215, respectively. The standoff 115 will engage the side wall 400 of the opening 210 and the standoff 120 will engage the side wall 405 of the opening 215. The engagement holds the leaf spring 105 from returning to its uncompressed state. It will be appreciated that as the distance X3 generally equals the distance X2, the leaf spring 105 can be substantially flat and parallel to the bolster plate 100 when loaded, if desired.

With further reference to FIGS. 2 and 4, upon threading a screw through each of the standoffs 115 and 120, the standoffs 115, 120 will move and become less engaged with the openings 210 and 215, which is referred to herein as one example of being released. Movement of the standoffs 115, 120 causes the leaf spring 105 to bend towards its uncompressed state and thereby will exert a force generally away from and generally perpendicular to the bolster plate 100. Of course, due to the shape of the leaf spring 105, the force may be applied at a variety of angles away from the bolster plate 100 which is still intended to mean generally perpendicular. The force will be applied against the processor module assembly 200 and will assist in holding components of the processor module assembly 200 together. In this manner, the leaf spring 105 is configured to be releasably attached to the bolster plate 100 until it is released upon assembly of the module.

Figure 5:
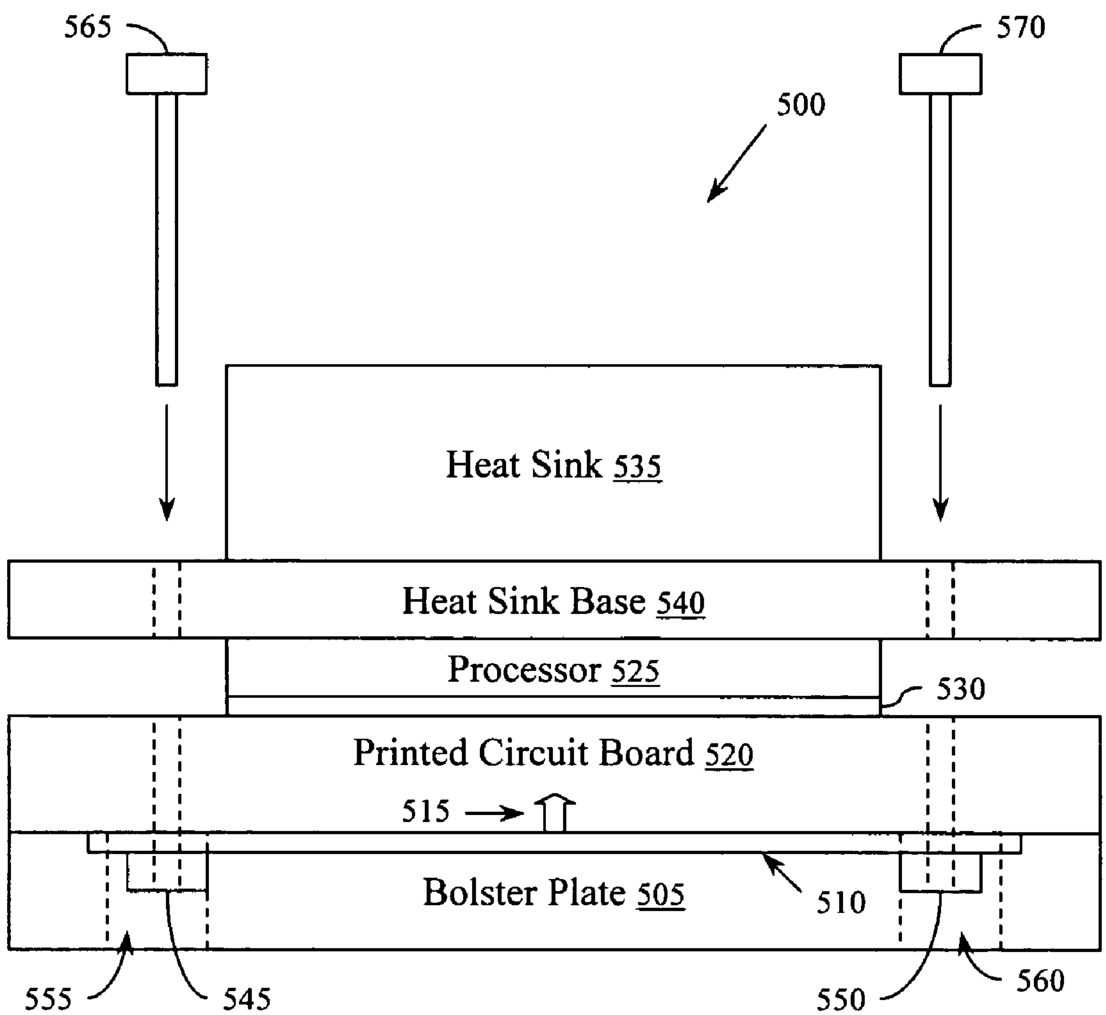
FIG. 5 illustrates one embodiment of an example processor module assembly.

Illustrated in FIG. 5 is an example of a processor module assembly 500 including an attached bolster plate 505. The bolster plate 505 includes a leaf spring 510 that is initially pre-loaded onto the bolster plate 505 and then is released during assembly to provide a force. The force is represented by arrow 515, which is exerted against a printed circuit board 520.

It will be appreciated that the processor module assembly 500 can include multiple layers of components and may have a greater or lesser number of components than illustrated. In one example, the printed circuit board 520 is positioned on the bolster plate 505 where the bolster plate is configured to support the printed circuit board 520. A processor can be disposed on the printed circuit board and be operably connected thereto. In another example, if a land grid array (LGA) chip is provided between the processor 525 and the circuit board 520, an interposer 530 can be inserted. The interposer 530 can include a plurality of contacts that have a degree of springiness so that the interposer 530 can adjust for gaps between the processor 525 and the circuit board 530. A heat sink 535 can be attached to the processor 525 via a heat sink base 540. The heat sink 535 can, for example, include a fan and a plurality of fins that direct air flow to cool the processor 525.

As explained in previous examples, the leaf spring 510 can be disposed between the bolster plate and the printed circuit board 520. Prior to assembly with the circuit board 520, the leaf spring 510 is configured to be releasably attached to the bolster plate 505 in a compressed state or otherwise, pre-loaded to the bolster plate 505. In the compressed state, the leaf spring 510 can be substantially parallel with the bolster plate 505. In one example, this can be performed by inserting standoffs 545 and 550 of the leaf spring 510 into corresponding openings 555, 560, respectively, in the bolster plate 505.

Upon an application of a force that secures the multiple layers of the assembly 500 to each other, the leaf spring 510 is configured to be released from the bolster plate 505 causing the leaf spring 510 to apply a force 515 to the printed circuit board 520 to assist in holding the multiple layers together. It will be appreciated that being "released" is intended to include the example where the leaf spring 510 changes from a first state (e.g. loaded state and applying little or no force in direction 515) to a second state (e.g. unloaded state and applying a greater force than the first state in the direction 515). In one example, the standoffs 545 and 550 include internally threaded openings that are aligned with threaded openings from other components of the assembly 500. For example, a screw 565 or other securing device can be threaded through various components of the assembly 500 such as the heat sink base 540, the printed circuit board 520, and through the standoff 545. Similarly, a screw 570 or other securing device can be threaded through openings and the standoff 550 of the leaf spring 510. The force from the screws 565 and 570 can be used to draw the components together as well as release the leaf spring 510 from the bolster plate 505, as previously described, to provide a force against the circuit board 520.

In another example, the bolster plate 505 can include a recess configured to accept the leaf spring 510. Once the leaf spring 510 is positioned in the recess and loaded into the openings 555 and 560, the leaf spring 510 can be substantially flush with the bolster plate 505. In another example, a load plate can be attached to the leaf spring 510 between the printed circuit board 520. The load plate can be configured to more evenly distribute the force 515 from the leaf spring 510 against the printed circuit board 520. One example of a load plate is described with reference to FIGS. 8 and 9.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks. While the figures illustrate various actions occurring in serial, it is to be appreciated that various actions could occur concurrently, substantially in parallel, and/or at substantially different points in time.

Figure 6:
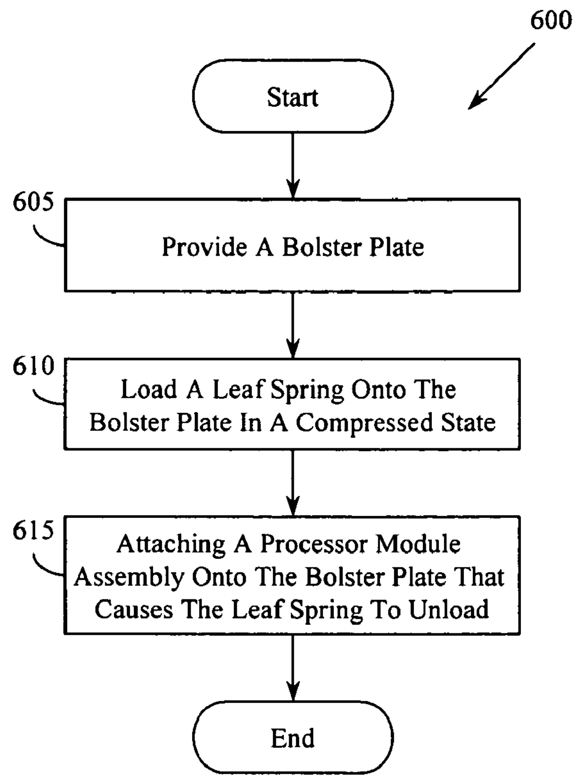
FIG. 6 illustrates an example methodology that can be associated with assembling a processor module.

With reference to FIG. 6, an example methodology 600 is described that can be associated with assembling a processor module. The methodology 600 can include providing a bolster plate (Block 605) and loading a leaf spring onto the bolster plate in a compressed state (Block 610). A processor module assembly can then be attached onto the bolster plate that causes the leaf spring to unload from the bolster plate (Block 615). As the leaf spring unloads, it is configured to exert a force upon the processor module assembly to assist in maintaining contact between components of the processor module assembly. The term unloading is used to also refer to the leaf spring changing states and to provide an increased force as compared to the loaded state.

In the compressed state, the leaf spring can be generally flat while when in an uncompressed state, the leaf spring has an arced shape. As such, the loading (Block 610) can include attaching the leaf spring to the bolster plate causing the leaf spring to be generally flat.

In one example configuration, the bolster plate can include a plurality of openings. As described in previous examples, the leaf spring can include a plurality of standoffs that project out from the leaf spring and are positioned within corresponding openings of the bolster plate to load the leaf spring to the bolster plate. With this configuration, the attaching (Block 615) can include threading a screw into each of the plurality of standoffs that causes the leaf spring to unload/release from the bolster plate.

The methodology 600 can optionally include positioning a load plate between the leaf spring and the processor module assembly. In one example, the positioning can include attaching the load plate to the leaf spring.

Figure 7:
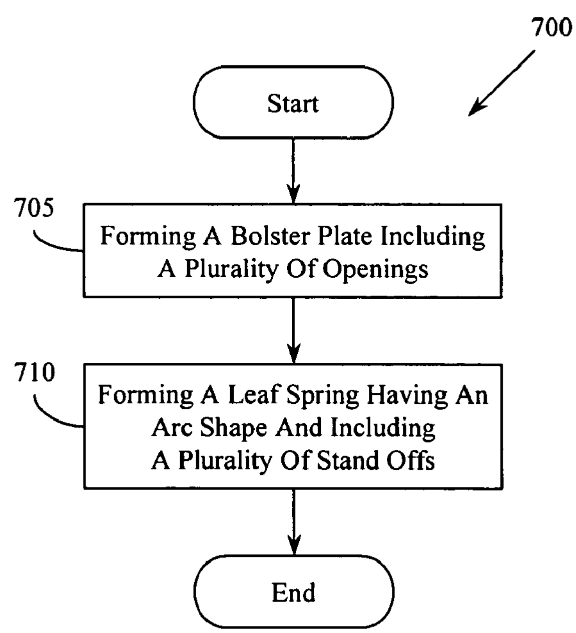
FIG. 7 illustrates an example methodology that can be associated with manufacturing a bolster plate assembly.

Illustrated in FIG. 7 is an example methodology 700 that can be associated with manufacturing a bolster plate assembly. For example, a bolster plate can be formed having a plurality of openings therethrough (Block 705). Each of the plurality of openings can be positioned to correspond to a standoff from a leaf spring. A leaf spring can be formed that has an arc shape while in an uncompressed state (Block 710). The leaf spring can include a plurality of standoffs projecting out from the leaf spring for being inserted into corresponding openings in the bolster plate. The plurality of standoffs can be configured to engage inner walls of the corresponding openings that causes the leaf spring to be loaded in a compressed state onto the bolster plate. Thus, the bolster plate and leaf spring can be pre-assembled by loading the leaf spring onto the bolster plate by inserting the standoffs into the corresponding openings.

The methodology 700 can optionally include forming a recess on the bolster plate that is configured to receive the leaf spring. In another example, the methodology 700 can include attaching a load plate to the leaf spring.

In one example, methodologies can be implemented as processor executable instructions and/or operations provided by a computer-readable medium. Thus, in one example, a computer-readable medium may store processor executable instructions operable to perform the method 700 using computer aided design software, a computer controlled assembly process, and the like. It is to be appreciated that other example methods described herein can also be stored on a computer-readable medium.

Figure 8:
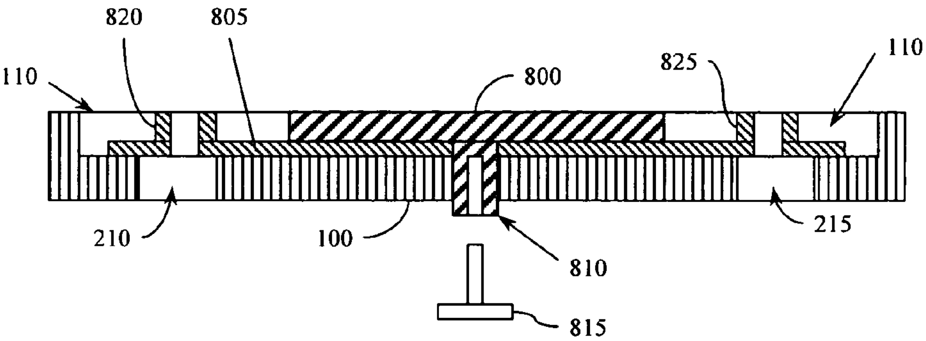
FIG. 8 illustrates one embodiment of an example bolster plate assembly including a load plate in cross-section view.
Figure 9:
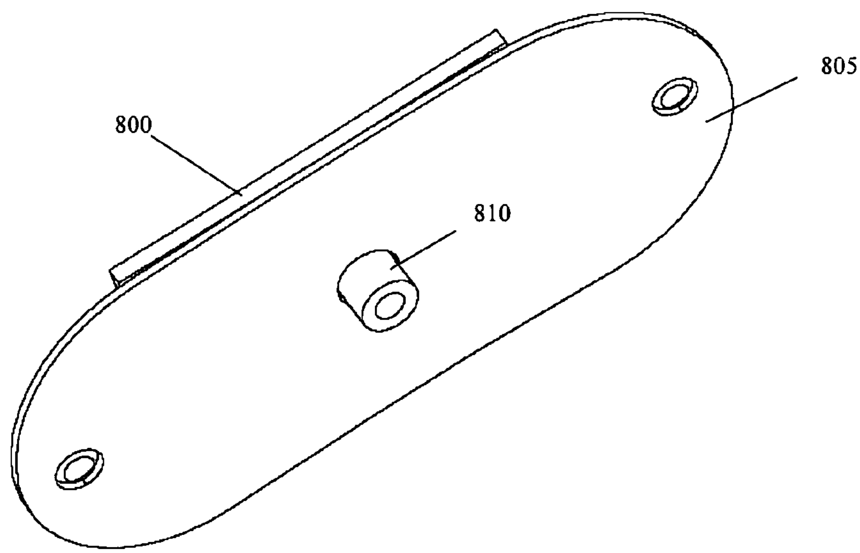
FIG. 9 illustrates a perspective view of an example leaf spring and load plate shown in FIG. 8.

Illustrated in FIG. 8 is another embodiment of a bolster plate assembly that includes a load plate 800. FIG. 8 shows an example cross-section view similar to FIG. 2. For simplicity of explanation, the bolster plate 100 as previously described in FIG. 1 is used in the present example. The bolster plate 100 includes the recess 110, although other configurations are possible. A leaf spring 805 can be positioned in the recess 110. In one example, the load plate 800 can be attached to the leaf spring 805 and the bolster plate 100 using a standoff 810 that passes through an opening in the leaf spring 805 and the bolster plate 100. FIG. 9 illustrates an example perspective view, from the bolster plate side, that shows the load plate 800 connected to the leaf spring 805.

With further reference to FIG. 8, a screw 815 can be threaded into the standoff 810 to secure the components together in a pre-loaded or pre-assembled manner. The screw 815 can be, for example, a shoulder screw or other securing device. A gap can be provided between the head of the screw 815 and the bottom of the bolster plate 100 that allows the leaf spring 805 to arch and move away from the bolster plate 100. The movement of the leaf spring 805 creates a force against the load plate 800 which in turn distributes the force against a circuit board or other component of a processor module assembly. The load plate 800 can be formed with a known stiffness and flatness to more evenly distribute the force from the leaf spring 805. In another example, the load plate 800 may not be attached to the leaf spring 805.

In one example, the leaf spring 805 can have an arced plate-like shape while in an uncompressed state, similar to the leaf spring 105 shown in FIG. 3. Although the leaf spring 805 is illustrated as being substantially flat against the bolster plate 100, the leaf spring 805 can be slightly arced away from the bolster plate 100 upon assembly. The leaf spring can also include a plurality of standoffs like standoffs 820, 825 that project out from the leaf spring 805. The standoffs 820, 825 can be formed on the load plate side of the bolster plate 100, which is in an opposite direction from the standoffs 115, 120 shown in the examples of FIGS. 1 and 3. Thus, the leaf spring 805 is not attached to the bolster plate 100 by way of the standoffs 820, 825, but rather by the standoff 810 and the screw 815 of the load plate 800. The standoffs 820, 825 can be threaded to received screws that attach the bolster plate assembly to other components of a processor module assembly similar to the example shown in FIG. 5.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Additional advantages and modifications will readily appear to those skilled in the art. Therefore, the invention is not limited to the specific details, the representative apparatus, and illustrative examples shown and described. Thus, this application is intended to embrace alterations, modifications, and variations that fall within the scope of the appended claims. Furthermore, the preceding description is not meant to limit the scope of the invention. Rather, the scope of the invention is to be determined by the appended claims and their equivalents.

To the extent that the term "includes" or "including" is employed in the detailed description or the claims, it is intended to be inclusive in a manner similar to the term "comprising" as that term is interpreted when employed as a transitional word in a claim. Furthermore, to the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

What is claimed is:

1. A bolster plate assembly for a semiconductor module assembly, comprising:

a bolster plate including a plurality of openings;

a leaf spring including a plurality of stand offs that project out from the leaf spring, the leaf spring being preloaded onto the bolster plate, where the leaf spring releasably attached to the bolster plate by positioning the plurality of stand offs within corresponding openings in the bolster plate, and the leaf spring being positioned to provide a force in a direction generally away from the bolster plate;

a first distance between two of the openings being greater than a second distance between two of the stand offs when the leaf spring is in an uncompressed state; and the leaf springs being configured to release from the bolster plate upon attaching a semiconductor module assembly to the bolster plate that causes the leaf spring to exert the force in the direction generally away from the bolster plate and against the semiconductor module assembly.

2. The bolster plate assembly of claim 1, the bolster plate including a recess configured to receive the leaf spring.

3. The bolster plate assembly of claim 1, where the plurality of stand offs are internally threaded; and the leaf spring is configured to change to the unlocked state by threading a screw into each of the plurality of stand offs.

4. The bolster plate assembly of claim 1 further including a load plate positioned on the leaf spring and configured to distribute the force exerted by the leaf spring to a semiconductor module assembly once attached to the bolster plate assembly.

5. The bolster plate assembly of claim 1 where the leaf spring includes a central portion that, upon attaching the semiconductor module assembly to the bolster plate that causes the leaf spring to exert the force, the leaf spring is configured where the central portion moves toward the semiconductor module assembly to exert the force against the semiconductor assembly.

6. The bolster plate assembly of claim 1 where the leaf spring includes a generally arc shape when in an uncompressed state.

7. The bolster plate assembly of claim 6, the leaf spring having about a 10 degree arc when in the uncompressed state.

8. A semiconductor module assembly having multiple layers, comprising:

a printed circuit board having a first side and a second side;

a bolster plate disposed on the first side of the printed circuit board and being configured to support the printed circuit board;

a processor disposed on the second side of the printed circuit board and being operably connected thereto;

a leaf spring disposed between the bolster plate and the first side of the printed circuit board, the leaf spring being configured to be releasably attached on the bolster plate in a compressed state where the leaf spring is substantially parallel with the bolster plate; and upon an application of a force that secures the multiple layers to each other, the leaf spring being configured to be released from the bolster plate causing the leaf spring to apply a force to the first side of the printed circuit board to assist in holding the multiple layers together.

9. The semiconductor module assembly of claim 8, further comprising a heat sink attached to the processor.

10. The processor module assembly of claim 8, further including:

an interposer positioned between the processor and the printed circuit board.

11. The bolster plate assembly of claim 8 where the leaf spring includes a central portion where upon the leaf spring releasing from the bolster plate, the central portion of the leaf spring is configured to move toward the printed circuit board.

12. The semiconductor module assembly of claim 8, the bolster plate including a recess configured to accept the leaf spring, the leaf spring being substantially flush with the bolster plate while the leaf spring is in the compressed state.

13. The semiconductor module assembly of claim 12 where:

the bolster plate includes a plurality of openings within the recess; and the leaf spring includes a plurality of stand offs that project out from the leaf spring and are positioned within corresponding openings in the recess.

14. The semiconductor module assembly of claim 13, where the plurality of stand offs are configured to engage side walls of the corresponding openings that causes the leaf spring to be releasably attached in the compressed state.

15. The semiconductor module assembly of claim 8, the leaf spring is an arced plate-like spring.

16. The semiconductor module assembly of claim 15 further including means for releasably attaching the leaf spring in the compress state.

17. The semiconductor module assembly of claim 8, further including a load plate positioned between the leaf spring and the printed circuit board to distribute force from the leaf spring to the printed circuit board.

18. The semiconductor module assembly of claim 17, the load plate being attached to the leaf spring.

* * * * *

UNITED STATES PATENT AND TRADEMARK OFFICE

CERTIFICATE OF CORRECTION

PATENT NO. : 7,344,384 B2
APPLICATION NO. : 10/972688
DATED : March 18, 2008
INVENTOR(S) : Brandon Aaron Rubenstein et al.

It is certified that error appears in the above-identified patent and that said Letters Patent is hereby corrected as shown below:

In column 7, line 62, in Claim 1, after “spring” insert -- is --.

In column 8, line 4, in Claim 1, delete “springs” and insert -- spring --, therefor.

Signed and Sealed this

Fifth Day of August, 2008

JON W. DUDAS
*Director of the United States Patent and Trademark Office*